(12) United States Patent
Han et al.

(10) Patent No.: US 7,548,304 B2
(45) Date of Patent: Jun. 16, 2009

(54) CHUCK PLATE ASSEMBLY WITH COOLING MEANS

(75) Inventors: Sang Jin Han, Suwon (KR); Sung Ho Lee, Yongin (KR); Myung Soo Huh, Suwon (KR); Seok Heon Jeong, Yongin (KR); Kwan Seop Song, Suwon (KR); Hee Cheol Kang, Suwon (KR)

(73) Assignee: Samsung Mobile Display Co., Ltd., Suwon-Si (KR)

( * ) Notice: Subject to any disclaimer, the term of this patent is extended or adjusted under 35 U.S.C. 154(b) by 618 days.

(21) Appl. No.: 11/298,566

(22) Filed: Dec. 12, 2005

(65) Prior Publication Data

US 2006/0154407 A1    Jul. 13, 2006

(30) Foreign Application Priority Data

Jan. 5, 2005   (KR) .................. 10-2005-0000965
Jan. 5, 2005   (KR) .................. 10-2005-0000966

(51) Int. Cl.
    *G03B 27/62*    (2006.01)
    *G03B 27/52*    (2006.01)
    *C23C 14/00*    (2006.01)
    *C23C 16/00*    (2006.01)

(52) U.S. Cl. .............. 355/75; 355/30; 204/298.09; 204/298.11; 118/720

(58) Field of Classification Search .......... 355/30, 355/75, 78; 204/298.09, 298.11; 430/5; 427/248.1, 256, 41; 118/720, 721, 504; 216/54
See application file for complete search history.

(56) References Cited

U.S. PATENT DOCUMENTS

2002/0062791 A1    5/2002   Ginovker et al.

2004/0089232 A1    5/2004   Sasaki et al.
2004/0232109 A1   11/2004   Yoshinaga

FOREIGN PATENT DOCUMENTS

| EP | 1384796 A2 | 1/2004 |
| JP | 2002-008859 A1 | 1/2002 |
| JP | 2002008859 A1 | 11/2002 |
| JP | 20030264223 A1 | 9/2003 |
| JP | 20040107723 A1 | 4/2004 |
| KR | 1020020024618 A | 4/2002 |
| KR | 1020040026266 A | 3/2004 |
| WO | WO03020999 A1 | 3/2003 |

OTHER PUBLICATIONS

English Translation of JP 2002-008859 (dated Jan. 11, 2002).*

* cited by examiner

*Primary Examiner*—Alan A Mathews
(74) *Attorney, Agent, or Firm*—H.C. Park & Associates, PLC

(57) ABSTRACT

The invention provides a chuck plate assembly that includes a shadow mask formed with a predetermined pattern; a shadow mask frame holding the shadow mask and having heat-radiating and cooling functions; a substrate aligned with the shadow mask and onto which deposition materials from a deposition source are deposited; and a chuck plate, attaching the substrate to the shadow mask, that includes a refrigerant circulating duct. The temperature of the substrate is optimized in consideration of the temperature of the shadow mask so that an alignment error due to thermal deformation is minimized. That is, the temperature of the shadow mask itself is prevented from rising, and thereby prevents deformation of the shadow mask due to thermal expansion, which improves the precision of a substrate pattern position.

17 Claims, 6 Drawing Sheets

CHUCK PLATE ASSEMBLY WITH COOLING MEANS

CROSS-REFERENCE TO RELATED APPLICATIONS

This application claims the benefit of Korean Patent Application Nos. 2005-0000965 and 2005-0000966, filed on Jan. 5, 2005, in the Korean Intellectual Property Office, the disclosure of which is incorporated herein by reference.

BACKGROUND

1. Field of the Invention

The present invention relates to a device that prevents thermal deformation of a glass substrate needed for an organic semiconductor device and more particularly, to a shadow mask frame having heat-radiating and cooling functions, and a chuck plate used in attaching a glass plate to a shadow mask and having a cooling means, in which a refrigerant is circulated in the chuck plate, thereby preventing the temperature from increasing in the glass plate due to radiant heat from a deposition source under a vacuum atmosphere or conductive heat caused by contact with a shadow mask, thereby improving precision of the alignment between the glass substrate and the shadow mask.

2. Discussion of Related Art

Generally, an organic thin film of an organic semiconductor device such as an organic light emitting diode, for example, is formed by evaporating a low molecular organic material under a vacuum atmosphere, or by using a spin coating method, a dip coating method, a doctor blade, or an inkjet printing method after dissolving a polymer organic material in a solvent.

In particular, where the thin film including the low molecular organic material is fabricated in the vacuum atmosphere, a shadow mask having a predetermined pattern is needed for depositing an organic material at a proper layer. The shadow mask is fixed to a shadow mask frame. When a glass substrate is provided it is aligned with and attached to the shadow mask, and then a film growth process is performed. During the film growth process, a dotted-type or linear-type organic material deposition source is used to deposit the low molecular organic material on the glass substrate according to a predetermined pattern.

FIG. 1 schematically illustrates a typical deposition process using a vertical type deposition source, which directs a low molecular organic material towards a mask having a predetermined pattern when an organic light emitting display is fabricated, for example. In the deposition process, a shadow mask 20 having a predetermined pattern is mounted to a shadow mask frame 10, and then a glass substrate 30 is aligned by a chuck plate 40 and a rubber magnet 50. Then, a deposition material from a vertical type deposition source 70 is deposited on the glass substrate 30 via the shadow mask 20. Here, the deposition process is performed in a vacuum atmosphere.

In the above described deposition process, radiant heat R is transferred from the deposition source to the shadow mask and, thus, increases its temperature. As the temperature of the shadow mask rises, it thermally expands and thereby decreases the precision of a pattern position of an organic light emitting diode. This reduces the precision of the pattern position for representing red R, green G and blue B colors and results in the mixing of R, G and B colors, whish is known as "discoloration defective."

Further, the glass substrate is affected by not only the radiant heat from the deposition source but also conductive heat due to direct contact with the shadow mask, so that the temperature of the glass substrate continuously rises. Particularly, in the case of the glass substrate, it is difficult to radiate away the heat, which accumulates via successive deposition processes. Therefore, the difference in thermal deformation between the glass substrate and the shadow mask becomes larger when only the shadow mask frame is cooled.

SUMMARY OF THE INVENTION

Accordingly, it is an aspect of the present invention to provide a shadow mask frame assembly which has a heat-radiating function to fundamentally prevent a radiant heat transfer from a deposition source, and a cooling function to prevent the heat from being accumulated in a shadow mask, thereby suppressing thermal expansion of the shadow mask. This improves the precision of a pattern position of an organic light emitting diode.

An embodiment of the invention provides a chuck plate assembly that includes a shadow mask formed with a predetermined pattern; a shadow mask frame to which the shadow mask is attached; and a cooling plate mounted on a portion of the shadow mask frame exposed to a deposition source.

Another embodiment of the invention provides a chuck plate assembly that includes a shadow mask formed with a predetermined pattern; a shadow mask frame for holding the shadow mask; a substrate aligned with the shadow mask and to which a deposition material from a deposition source is deposited; and a chuck plate attaching the substrate to the shadow mask by having a front surface facing the deposition source closely attached to a back surface of the substrate facing away from the deposition source, wherein the chuck plate includes a refrigerant circulating duct through which a refrigerant circulates.

In yet another embodiment of the invention, a chuck plate assembly further comprises an external cooling plate mounted on a back surface of the chuck plate opposite surface attached to the substrate. In this embodiment, the external cooling plate, rather than the chuck plate, includes the refrigerant circulating duct through which the refrigerant circulates.

BRIEF DESCRIPTION OF THE DRAWINGS

These and other aspects of the invention will become apparent and more readily appreciated from the following description of the preferred embodiments, taken in conjunction with accompanying drawings.

DETAILED DESCRIPTION OF PREFERRED EMBODIMENTS

Hereinafter, preferable embodiments according to the present invention will be described with reference to the accompanying drawings, wherein embodiments of the present invention are provided to be readily understood by those skilled in the art.

Figure 1:
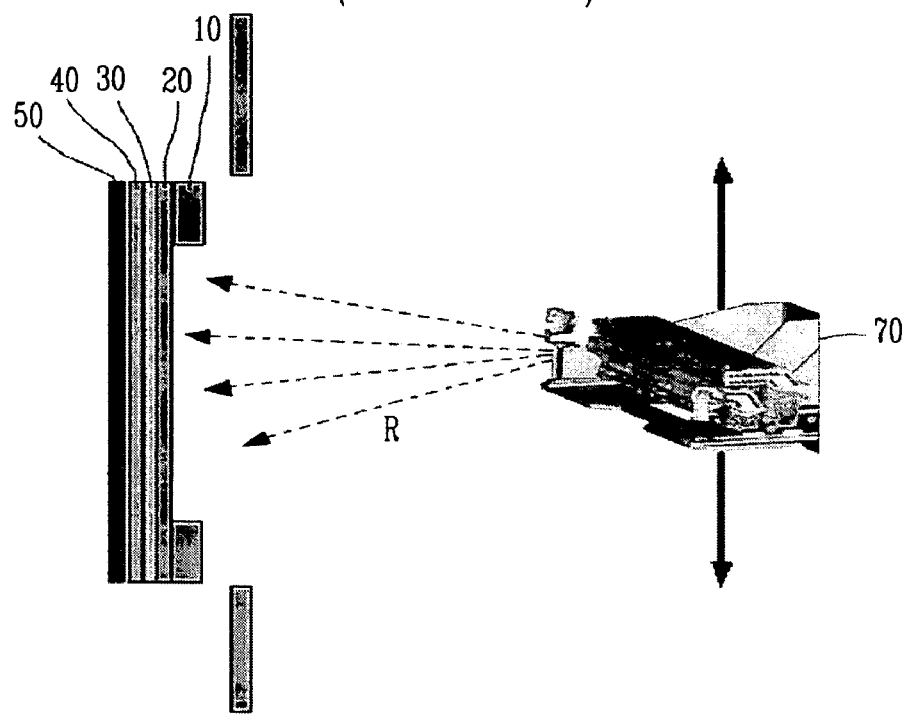
FIG. 1 is a schematic view for illustrating a general deposition process using a vertical type deposition source.
Figure 2:
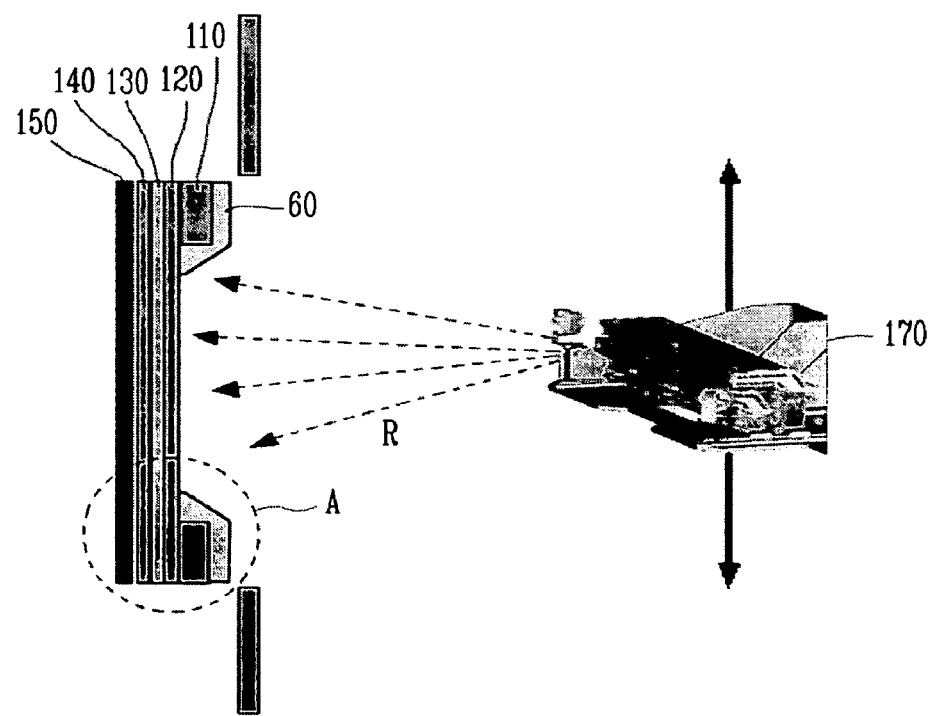
FIG. 2 is a schematic view for illustrating a deposition process with a mask frame according to an embodiment of the present invention.

As shown in FIG. 2, a shadow mask 120 having a predetermined pattern is mounted to a shadow mask frame 110. In a general deposition process, a distance from a deposition source 170 to the shadow mask 120 and a substrate 130 can be approximately 300 mm or more, and the deposition source 170 has a nozzle temperature of about 200° C. Therefore, radiant heat R from the deposition source 170 causes the shadow mask 120 to thermally expand. At this time, the thermal expansion of the shadow mask 120 is directly affected by the temperature of the shadow mask frame 110.

A heat radiating method or a cooling method can be used to suppress the thermal expansion of the shadow mask 120. The heat-radiating method intercepts the radiant heat R from the deposition source 170. The cooling method prevents the heat from being accumulated in the shadow mask 120.

According to an embodiment of the present invention, a cooling plate 60 can be mounted to a portion of the shadow mask frame 110 facing the deposition source 170, thereby performing both the heat-radiating and cooling methods. The cooling plate 60 intercepts the radiant heat R from the shadow mask frame 110 and removes the heat accumulated in the shadow mask frame 110.

The cooling plate 60, which is mounted to the mask frame 110 that faces the vertical type deposition source 170 and is exposed to the radiant heat, prevents the temperature of the shadow mask frame 110 from rising. This prevents deformation of the shadow mask 120 due to the thermal expansion, thereby enhancing precision in a pattern position.

In the meantime, a problem may arise wherein the cooling plate 60 may obstruct a deposition material from the vertical type deposition source 170 and thus decrease a film growth region of the substrate.

Figure 3:
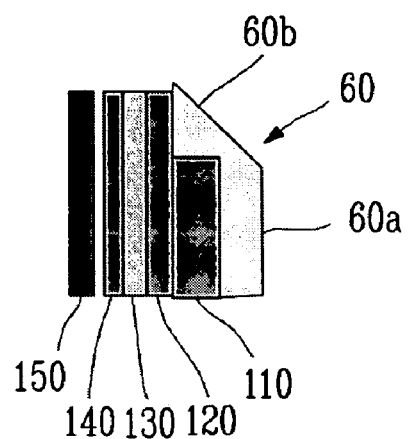
FIG. 3 is an enlarged view of "A" in FIG. 2.
Figure 4:
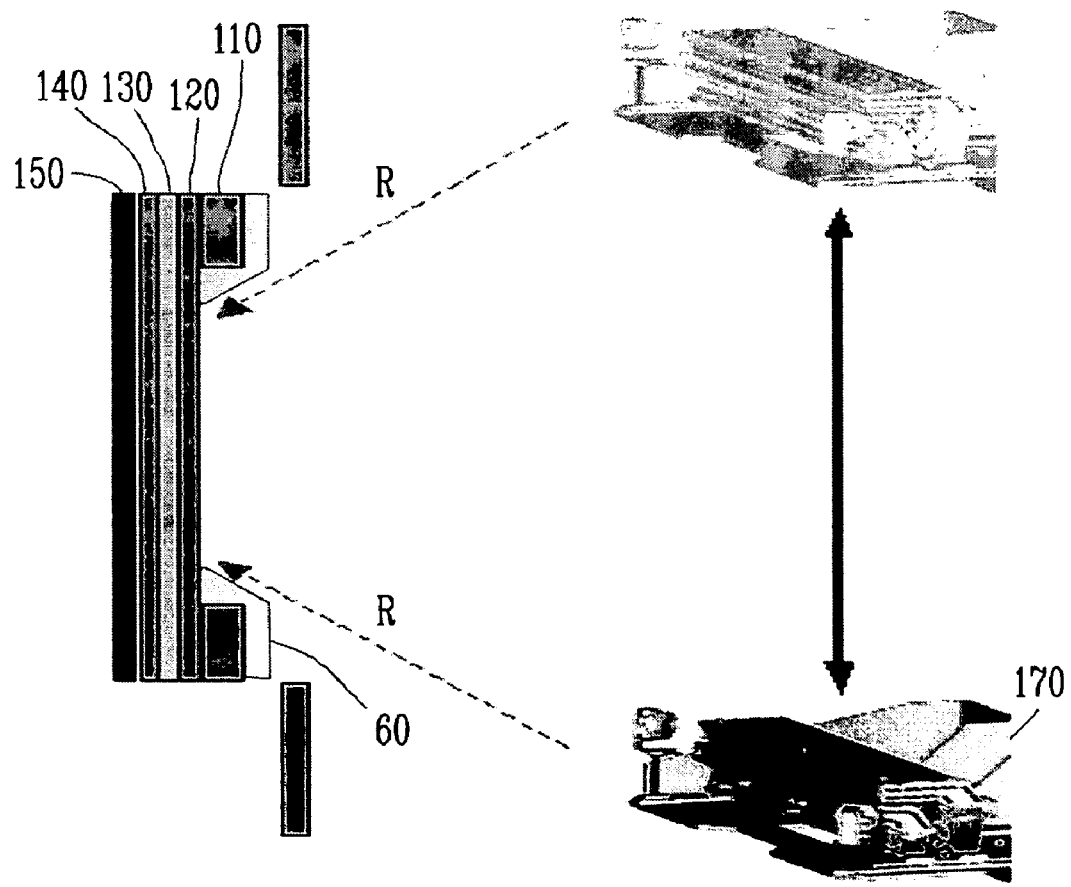
FIG. 4 is a schematic view for illustrating a cooling plate mounted to the mask frame according to an embodiment of the present invention, wherein the cooling plate is capable of preventing a shadow phenomenon.

To solve this problem, the cooling plate 60 may include an exposure portion 60a facing the deposition source 170, and an inner portion 60b facing the film growth region as shown in FIG. 3 and FIG. 4. Here, the inner portion 60b of the cooling plate 60 is tapered. Because the inner portion 60b of the cooling plate 60 has a tapered profile, the film growth region of the substrate is secured regardless of variations in the vertical position of the deposition source 170, thereby preserving the film growth region.

Preferably, the cooling plate 60 surrounds the mask frame 110 entirely so as to heighten the heat-radiating and cooling effects of the mask frame 110.

Further, the cooling plate 60 according to an embodiment of the present invention can be made of various heat-radiating materials as known to those persons of ordinary skill in the art.

Figure 5:
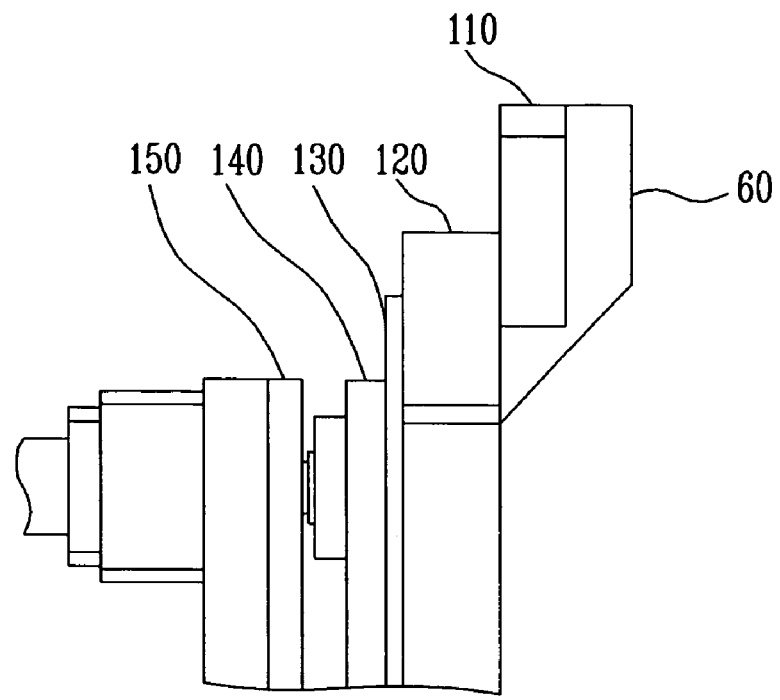
FIG. 5 is a detailed and enlarged sectional view for illustrating alignment and attachment between a glass substrate and a shadow mask according to an embodiment of the present invention.

Looking at FIG. 5, the glass substrate 130 and the shadow mask 120 are aligned and attached by a chuck plate and a rubber magnet 150, and the cooling plate 60 having the tapered profile is mounted to the shadow mask frame 110. The cooling plate 60 intercepts the radiant heat from the deposition source 170 and prevents the heat from being accumulated in the shadow mask 120. However, the cooling plate 60 does not completely prevent the temperature of the glass substrate 130 from being affected by the radiant heat transferred from the deposition source 170 and the conductive heat due to direct contact with the shadow mask 120. Therefore, in the case where only the shadow mask frame 110 is cooled, the difference in thermal deformation between the glass substrate 130 and the shadow mask 120 widens.

Figure 6:
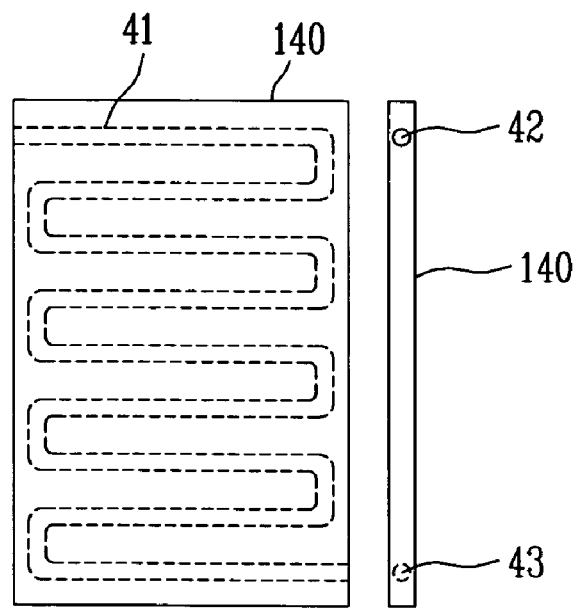
FIG. 6 shows a schematic plan view and a schematic side view of a chuck plate for cooling a glass substrate according to another embodiment of the present invention.

To solve this problem, the present invention can provide a chuck plate for cooling a glass substrate according to another embodiment of the present invention, as shown in FIG. 6, for example.

Figure 7:
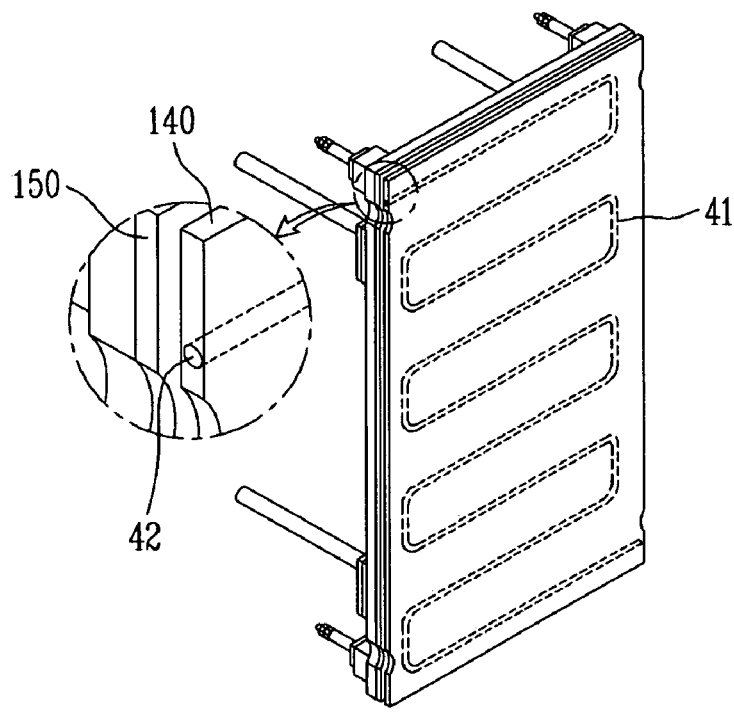
FIG. 7 is a perspective view of the chuck plate according to another embodiment of the present invention.
Figure 8:
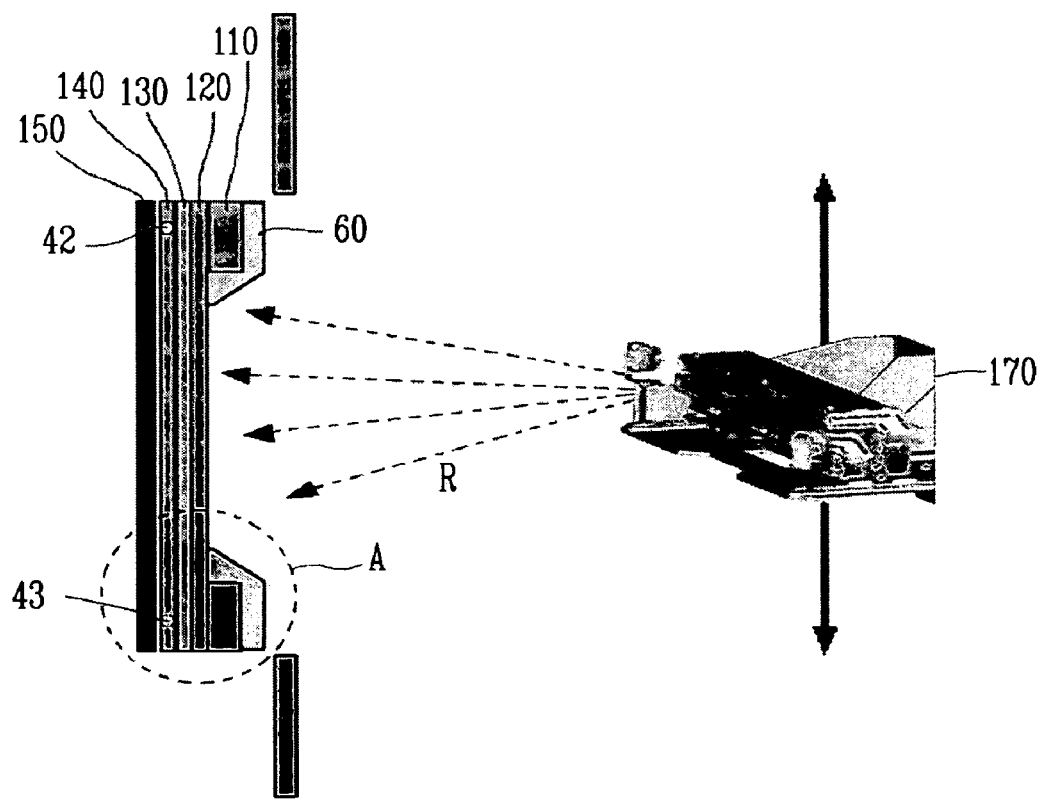
FIG. 8 is a schematic view of the deposition process using the chuck plate according to another embodiment of the present invention.

Referring to FIG. 6, FIG. 7, and FIG. 8, a chuck plate assembly may include a shadow mask 120 having a predetermined pattern; a shadow mask frame 110 to hold the shadow mask 120; a cooling plate 60 placed in a part of the shadow mask frame 110 exposed to a deposition source that prevents thermal deformation in the shadow mask frame 110; and a chuck plate 140 making a glass substrate 130 be aligned with and attached to the shadow mask 120. The chuck plate 140 can be formed with a refrigerant circulating duct 41. Deposition materials are deposited from the deposition source onto the glass substrate 130, forming a predetermined pattern.

The chuck plate 140 supports the glass substrate 130 from its back side and makes the glass substrate 130 be aligned with and attached to the shadow mask 120. The refrigerant circulating duct 41 is directly formed inside the chuck plate 140 so that a refrigerant is circulated through the refrigerant circulating duct 41, thereby cooling the glass substrate 130.

The chuck plate 140 can be made of aluminum and attached to cover a back side of the glass substrate 130 in the deposition process, thereby having a good cooling effect on the glass substrate 130.

The refrigerant circulating duct 41 can be formed inside the chuck plate 140 by various methods. The longer the refrigerant circulating duct 41 is, the better the cooling effect is given to the glass substrate 130. Thus, the refrigerant circulating duct 41 is preferably lengthened to enhance this cooling effect.

Further, the refrigerant circulating duct 41 can be designed in consideration of the size of the chuck plate 140 and the desired cooling effect, for example. As shown in FIG. 6 and FIG. 7, the refrigerant circulating duct 41 has an inlet 42 placed at a first edge of the chuck plate 140, and an outlet 43 placed at a second edge of the chuck plate 140. Alternatively, the inlet 42 and the outlet 43 of the refrigerant circulating duct 41 may be placed at the same edge of the chuck plate 140.

Additionally, a temperature adjuster (not shown) may be provided to adjust the temperature of the refrigerant circulating through the refrigerant circulating duct 41. In this case, the temperature of the refrigerant circulating through the refrigerant circulating duct 41 can be optimized in consideration of the temperature of the glass substrate 130 and the shadow mask 120. Further, a thermometer (not shown) may be provided to measure the temperature of the shadow mask 120.

Looking at FIG. 8, when radiant heat R is transferred from the deposition source 170 to the shadow mask 120 and the glass substrate 130, the cooling plate 60 mounted to the shadow mask frame 110 suppresses the temperature of the shadow mask frame 110 from rising, and thus prevents the shadow mask 120 from thermal deformation due to thermal expansion of the shadow mask 120.

Further, the refrigerant circulates through the refrigerant circulating duct 41 formed inside the chuck plate 140 employed for making the shadow mask 120 be aligned with and attached to the glass substrate 130, so that the glass substrate 130 is cooled, thereby minimizing difference in the thermal deformation between the glass substrate 130 and the shadow mask 120.

As the temperature of the refrigerant circulating through the refrigerant circulating duct 41 is optimized in consideration of the temperature of the shadow mask 120, the temperature difference between the glass substrate 130 and the shadow mask 120 is minimized. Thus, an alignment error due to the thermal expansion of the glass substrate 130 and the shadow mask 120 is minimized, thereby improving precision in the alignment between the glass substrate 130 and the shadow mask 120.

Figure 9:
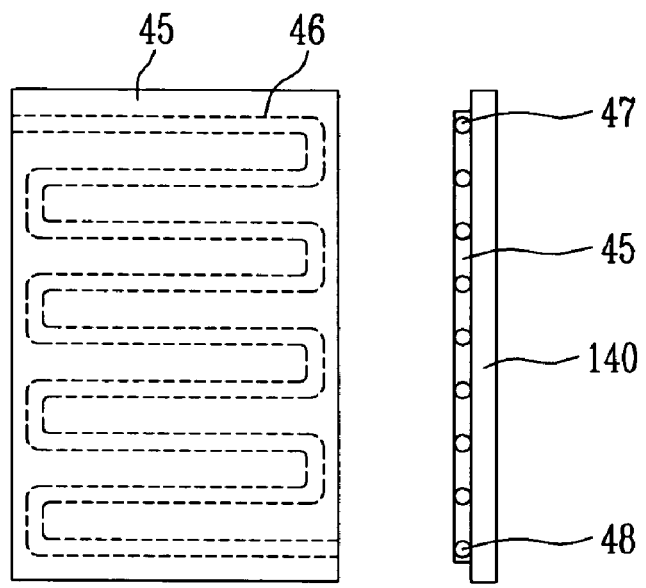
FIG. 9 shows a schematic plan view and a schematic side view of a chuck plate for cooling a glass substrate according to yet another embodiment of the present invention.
Figure 10:
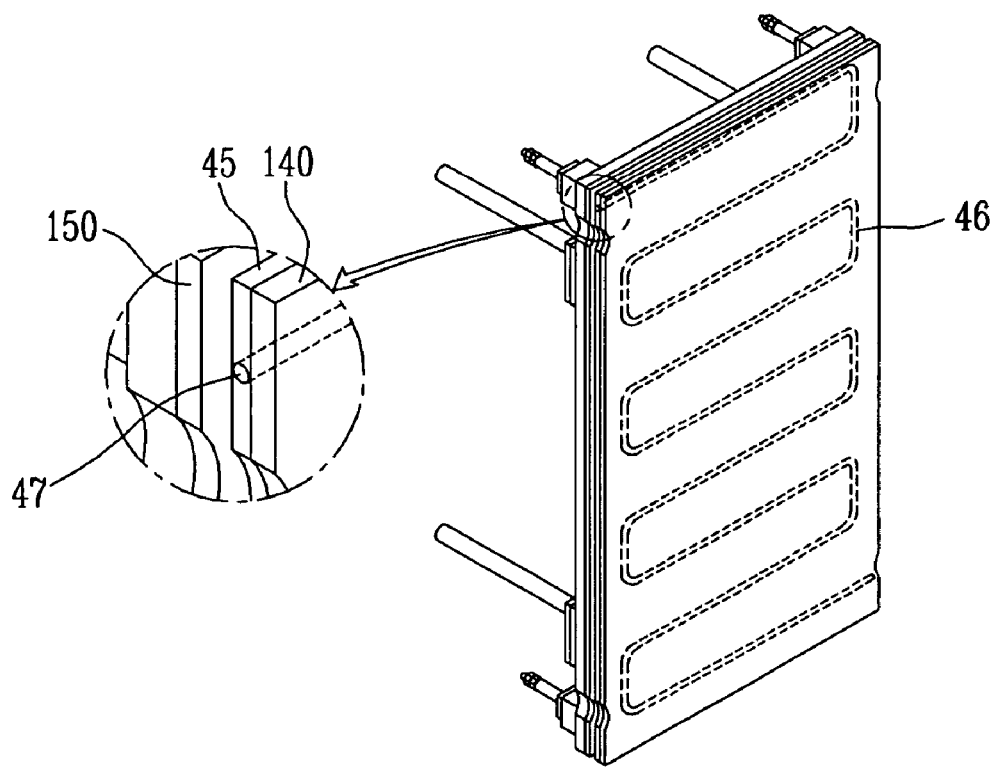
FIG. 10 is a perspective view of the chuck plate according to yet another embodiment of the present invention.
Figure 11:
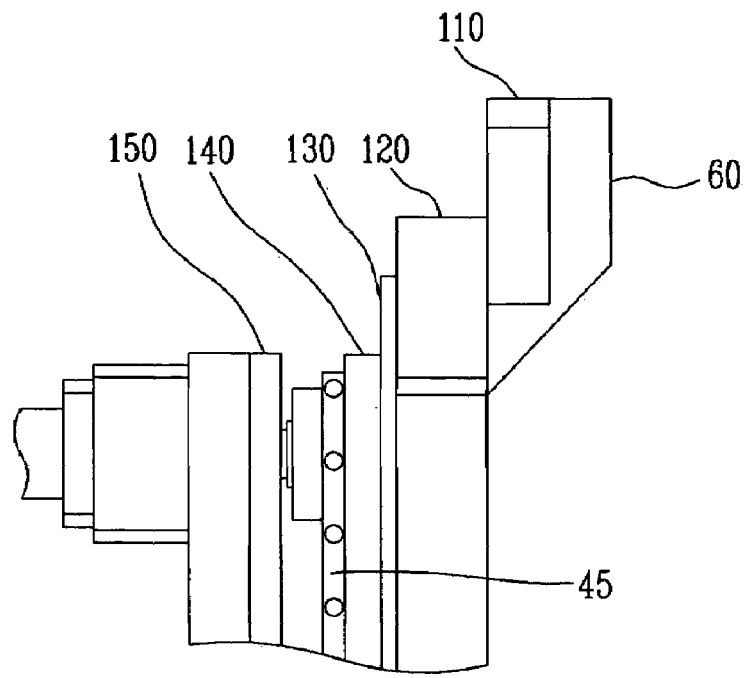
FIG. 11 is a detailed and enlarged sectional view for illustrating alignment and attachment between a glass substrate and a shadow mask according to yet another embodiment of the present invention.

As shown in FIG. 9 through FIG. 11, a chuck plate assembly according to yet another embodiment of the present invention may further include an external cooling plate 45 mounted on the outside of the chuck plate 140 formed with a refrigerant circulating duct 46.

The same considerations that apply to refrigerant circulating duct 41, described above, also apply to refrigerant circulating duct 46.

The refrigerant circulating duct 46 has an inlet 47 placed at a first edge of the external cooling plate 45, and an outlet 48 placed at a second edge of the external cooling plate 45. Alternatively, the inlet 47 and the outlet 48 of the refrigerant circulating duct may be placed at the same edge of the cooling plate 45. A temperature adjuster (not shown) and a thermometer (not shown) may also be used to optimize the temperature of the glass substrate 130 and the shadow mask 120.

Figure 12:
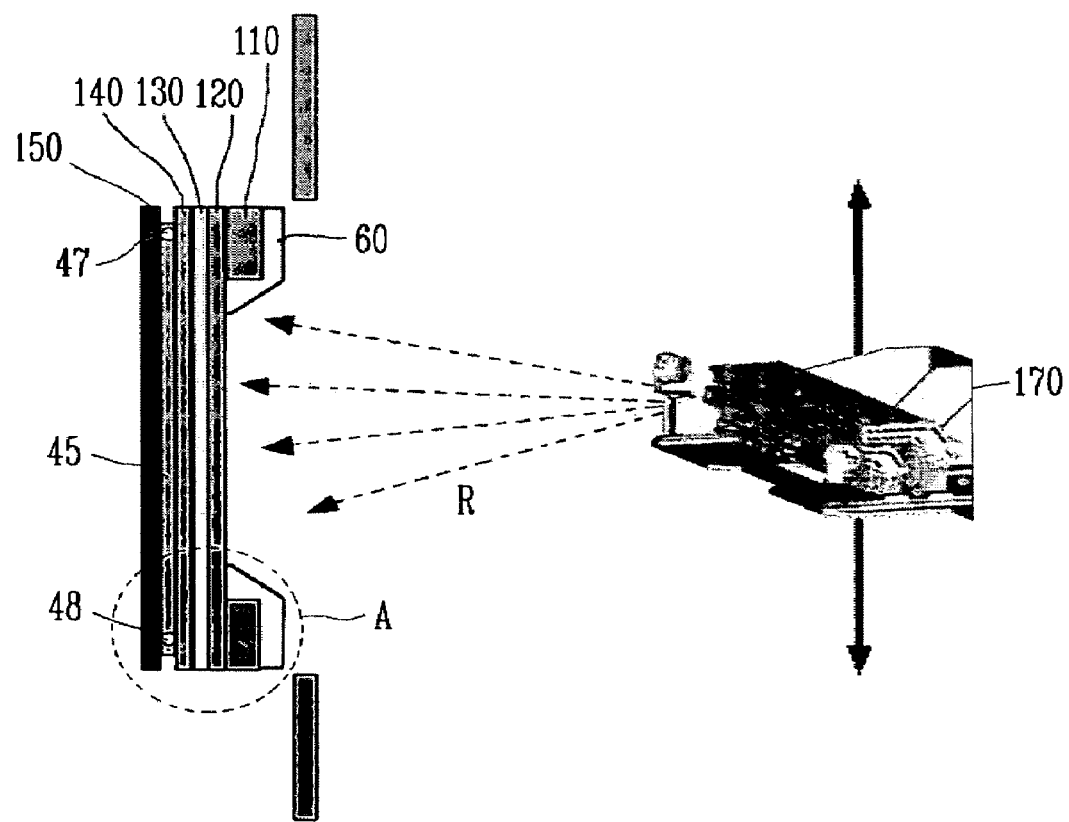
FIG. 12 is a schematic view of the deposition process using the chuck plate according to yet another embodiment of the present invention.

Referring to FIG. 12, the refrigerant circulates through the refrigerant circulating duct 46 formed inside the external cooling plate 45 that is mounted to the outside of the chuck plate 140 so that the glass substrate 130 is indirectly cooled, thereby minimizing difference in the thermal deformation between the glass substrate 130 and the shadow mask 120. Here, the external cooling plate 45, according to yet another embodiment of the present invention, may be made of various heat-radiating materials as known to persons having ordinary skill in the art.

As described above, when the cooling plate is mounted to a portion of the shadow mask frame facing the deposition source, not only the radiant heat from the deposition source is intercepted by cooling plate 60, but also the temperature of the shadow mask itself is prevented from rising, so that deformation of the shadow mask due to thermal expansion is prevented, thereby also preventing degradation of the pattern position precision caused by the thermal expansion of the shadow mask 120.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A chuck plate assembly, comprising:
   a shadow mask formed with a predetermined pattern;
   a shadow mask frame to which the shadow mask is attached;
   a cooling plate mounted on a portion of the shadow mask frame exposed to a deposition source,
   wherein the cooling plate has an inner portion extending towards a film growth region, the inner portion having a tapered profile.

2. The chuck plate assembly of claim 1, wherein the cooling plate is mounted to entirely surround the shadow mask frame.

3. The chuck plate assembly of claim 1, wherein the deposition source is vertically movable along a plane substantially parallel to a surface of the shadow mask facing the deposition source.

4. A chuck plate assembly, comprising:
   a shadow mask formed with a predetermined pattern; a shadow mask frame for holding the shadow mask;
   a substrate aligned with the shadow mask and to which a deposition material from a deposition source is deposited;
   a chuck plate attaching the substrate to the shadow mask by having a front surface facing the deposition source closely attached to a back surface of the substrate facing away from the deposition source, wherein the chuck plate includes a refrigerant circulating duct through which a refrigerant circulates; and
   a cooling plate mounted on a portion of the shadow mask frame exposed to the deposition source,
   wherein the cooling plate has an inner portion extending towards a film growth region, the inner portion having a tapered profile.

5. The chuck plate assembly of claim 4, wherein the refrigerant circulating duct has an inlet and an outlet.

6. The chuck plate assembly of claim 4, wherein the chuck plate comprises aluminum.

7. The chuck plate assembly of claim 4, wherein the deposition source is vertically movable along a plane substantially parallel to a front surface of the substrate facing the deposition source.

8. The chuck plate assembly of claim 4, further comprising a temperature adjuster to adjust a temperature of the refrigerant circulating through the refrigerant circulating duct based on a temperature of the shadow mask.

9. The chuck plate assembly of claim 8, further comprising a thermometer to measure the temperature of the shadow mask.

10. A chuck plate assembly, comprising:
    a shadow mask formed with a predetermined pattern;
    a shadow mask frame for holding the shadow mask;
    a substrate aligned with the shadow mask and to which a deposition material from a deposition source is deposited; and
    a chuck plate attaching the substrate to the shadow mask by having a front surface facing the deposition source closely attached to a back surface of the substrate facing away from the deposition source; and
    an external cooling plate mounted on a back surface of the chuck plate opposite the front surface closely attached to the substrate, wherein the external cooling plate includes a refrigerant circulating duct through which a refrigerant circulates.

11. The chuck plate assembly of claim 10, wherein the refrigerant circulating duct has an inlet and an outlet.

12. The chuck plate assembly of claim 10, wherein the chuck plate comprises aluminum.

13. The chuck plate assembly of claim 10, further comprising a shadow mask cooling plate mounted on a portion of the shadow mask frame exposed to the deposition source.

14. The chuck plate assembly of claim 13, wherein the shadow mask cooling plate has an inner portion extending towards a film growth region, the inner portion having a tapered profile.

15. The chuck plate assembly of claim 14, wherein the deposition source is vertically movable along a plane substantially parallel to a front surface of the substrate facing the deposition source.

16. The chuck plate assembly of claim 10, further comprising a temperature adjuster to adjust a temperature of the refrigerant circulating through the refrigerant circulating duct based on a temperature of the shadow mask.

17. The chuck plate assembly of claim 16, further comprising a thermometer to measure the temperature of the shadow mask.

* * * * *